United States Patent
Rupp et al.

(10) Patent No.: US 11,715,768 B2
(45) Date of Patent: *Aug. 1, 2023

(54) SILICON CARBIDE COMPONENTS AND METHODS FOR PRODUCING SILICON CARBIDE COMPONENTS

(71) Applicant: Infineon Technologies AG, Neubiberg (DE)

(72) Inventors: Roland Rupp, Lauf (DE); Ronny Kern, Villach (AT)

(73) Assignee: Infineon Technologies AG, Neubiberg (DE)

(*) Notice: Subject to any disclaimer, the term of this patent is extended or adjusted under 35 U.S.C. 154(b) by 120 days.

This patent is subject to a terminal disclaimer.

(21) Appl. No.: 17/350,586

(22) Filed: Jun. 17, 2021

(65) Prior Publication Data

US 2021/0313431 A1 Oct. 7, 2021

Related U.S. Application Data

(63) Continuation of application No. 16/111,810, filed on Aug. 24, 2018, now Pat. No. 11,069,778.

(30) Foreign Application Priority Data

Aug. 25, 2017 (DE) .......................... 102017119568.8

(51) Int. Cl.
  *H01L 31/0312* (2006.01)
  *H01L 29/16* (2006.01)
  (Continued)

(52) U.S. Cl.
  CPC .... *H01L 29/1608* (2013.01); *H01L 21/02378* (2013.01); *H01L 21/02529* (2013.01);
  (Continued)

(58) Field of Classification Search
  CPC .......... H01L 29/1608; H01L 21/02378; H01L 21/02529; H01L 21/02694; H01L 21/046;
  (Continued)

(56) References Cited

U.S. PATENT DOCUMENTS 11,069,778 B2 * 7/2021 Rupp ................ H01L 29/66068
2003/0203547 A1 10/2003 Sakaguchi et al.
(Continued)

FOREIGN PATENT DOCUMENTS

CN 102891182 A 1/2013
CN 103578927 A 2/2014
(Continued)

OTHER PUBLICATIONS

"Cold Split", Siltectra Solution, Siltectra GmbH, 2017, Accessed online at https://www.siltectra.com/en/technologie/siltectra-losung on Aug. 29, 2017.
(Continued)

*Primary Examiner* — Caleb E Henry
*Assistant Examiner* — Dilinh P Nguyen
(74) *Attorney, Agent, or Firm* — Murphy, Bilak & Homiller, PLLC

(57) ABSTRACT

A method for producing a silicon carbide component includes forming a silicon carbide layer on an initial wafer, forming a doping region of the silicon carbide component to be produced in the silicon carbide layer, and forming an electrically conductive contact structure of the silicon carbide component to be produced on a surface of the silicon carbide layer. The electrically conductive contact structure electrically contacts the doping region. Furthermore, the method includes splitting the silicon carbide layer or the initial wafer after forming the electrically conductive contact structure, such that a silicon carbide substrate at least of the silicon carbide component to be produced is split off.

16 Claims, 4 Drawing Sheets

(51) Int. Cl.
*H01L 21/78* (2006.01)
*H01L 29/66* (2006.01)
*H01L 21/02* (2006.01)
*H01L 21/04* (2006.01)
*H01L 21/268* (2006.01)
*H01L 21/304* (2006.01)
*H01L 29/06* (2006.01)
*H01L 21/265* (2006.01)
*H01L 29/739* (2006.01)
*H01L 29/78* (2006.01)
*H01L 29/872* (2006.01)

(52) U.S. Cl.
CPC ...... *H01L 21/02694* (2013.01); *H01L 21/046* (2013.01); *H01L 21/268* (2013.01); *H01L 21/304* (2013.01); *H01L 21/7813* (2013.01); *H01L 29/0615* (2013.01); *H01L 29/6606* (2013.01); *H01L 29/66068* (2013.01); *H01L 21/26506* (2013.01); *H01L 29/7395* (2013.01); *H01L 29/7827* (2013.01); *H01L 29/872* (2013.01)

(58) Field of Classification Search
CPC . H01L 21/268; H01L 21/304; H01L 29/0615; H01L 29/872
USPC .............................................. 257/77; 438/105
See application file for complete search history.

(56) References Cited

U.S. PATENT DOCUMENTS

| | | |
|---|---|---|
| 2004/0248344 A1 | 12/2004 | Partridge et al. |
| 2013/0228905 A1 | 9/2013 | Von Koblinski et al. |
| 2014/0264374 A1 | 9/2014 | Hecht et al. |
| 2015/0097328 A1 | 4/2015 | Wang et al. |
| 2015/0214040 A1 | 7/2015 | Celler |
| 2017/0033011 A1 | 2/2017 | Rupp et al. |
| 2017/0179285 A1* | 6/2017 | Lochtefeld ........ H01L 29/78684 |

FOREIGN PATENT DOCUMENTS

| | | |
|---|---|---|
| JP | 2002280531 A | 9/2002 |
| JP | 2006210569 A | 8/2006 |
| JP | 2009507364 A | 2/2009 |
| JP | 2010506406 A | 2/2010 |
| JP | 2012231172 A | 11/2012 |
| JP | 2013125971 A | 6/2013 |
| JP | 2014057035 A | 3/2014 |
| JP | 2014143248 A | 8/2014 |
| JP | 2014179605 A | 9/2014 |
| WO | 2016114382 A1 | 7/2016 |

OTHER PUBLICATIONS

"Pilot line for low-cost SiC wafer to launch in 2016", Semiconportal, Aug. 22, 2014, Accessed online at https://www.semiconportal.com/en/archive/news/news-by-sin/140822-sicoxs-sic-wafer.html on Aug. 3, 2018.

Belforte, David, "Disco develops high-speed laser wafer slicing technology", Industrial Laser Solutions, Aug. 15, 2016, Accessed online at http://www.industrial-lasers.com/articles/2016/08/disco-develops-high-speed-laser-wafer-slicing-technology.html on Aug. 3, 2017.

Kimoto, Tsunenobu, et al., "Fundamentals of Silicon Carbide Technology: Growth, Characterization, Devices and Applications", Wiley—IEEE Press, 2014.

Rupp, R., et al., "Laser backside contact annealing of SiC Power devices: A Prerequisite for SiC thin wafer technology.", 2013 25th International Symposium on Power Semiconductor Devices & IC's (ISPSD), Kanazawa, Japan, May 26-30, 2013.

* cited by examiner

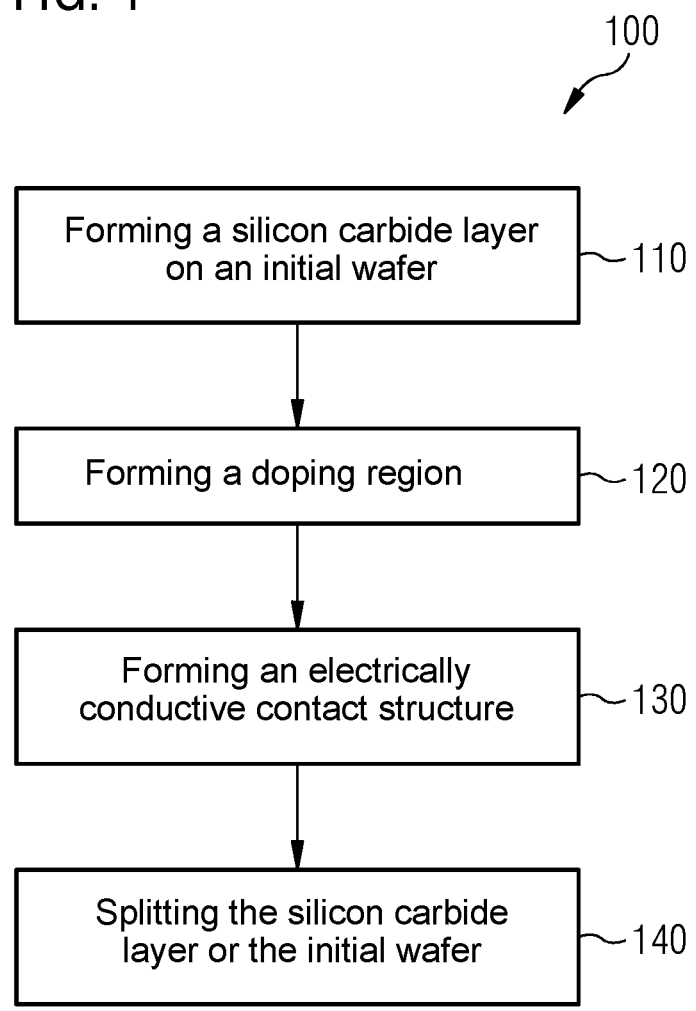

SILICON CARBIDE COMPONENTS AND METHODS FOR PRODUCING SILICON CARBIDE COMPONENTS

RELATED APPLICATIONS

The instant applications is a continuation of and claims priority to U.S. application Ser. No. 16/111,810 filed on Aug. 24, 2018, the content of which is incorporated by reference in its entirety, which in turn claims priority to German Patent Application 102017119568.8 filed on Aug. 25, 2017, the content of which is incorporated by reference in its entirety.

TECHNICAL FIELD

Examples relate to concepts for reusing silicon carbide wafers, and in particular to silicon carbide components and methods for producing silicon carbide components.

BACKGROUND

Even though the silicon carbide (SiC) basic material costs per area have decreased significantly in the last decade, they are still more than one order of magnitude higher than the corresponding costs of silicon (Si) wafers. The costs for the individual wafer rise significantly with each diameter step (e.g. from 100 mm to 150 mm). However, since the wafers themselves make no or hardly any contribution to the electrical function of the components that arise thereon, methods are sought to eliminate or to reduce this large cost contribution.

There may be a need to provide concepts for reusing silicon carbide wafers which enable the costs of silicon carbide components to be reduced.

SUMMARY

Some exemplary embodiments relate to a method for producing a silicon carbide component comprising forming a silicon carbide layer on an initial wafer, forming a doping region of the silicon carbide component to be produced in the silicon carbide layer, and forming an electrically conductive contact structure of the silicon carbide component to be produced on a surface of the silicon carbide layer. The electrically conductive contact structure electrically contacts the doping region. Furthermore, the method comprises splitting the silicon carbide layer or the initial wafer after forming the electrically conductive contact structure, such that a silicon carbide substrate at least of the silicon carbide component to be produced is split off.

Some exemplary embodiments relate to a method for producing a silicon carbide component comprising forming a silicon carbide layer on an initial wafer, forming a doping region of the silicon carbide component to be produced in the silicon carbide layer, and splitting the silicon carbide layer or the initial wafer after forming the doping region, such that a silicon carbide substrate at least of the silicon carbide component to be produced is split off. Furthermore, the silicon carbide substrate has a thickness of more than 30 μm.

Some exemplary embodiments relate to a silicon carbide component comprising a silicon carbide substrate having a thickness of more than 30 μm and a doping region of the silicon carbide component arranged at a first surface of the silicon carbide substrate. A point defect density in the centre of the silicon carbide substrate between the first surface and an opposite second surface of the silicon carbide substrate is less than $5*10^{14}$ cm$^{-3}$.

Those skilled in the art will recognize additional features and advantages upon reading the following detailed description, and upon viewing the accompanying drawings.

BRIEF DESCRIPTION OF THE DRAWINGS

Some examples of devices and/or methods are described below exclusively by way of example and with reference to the accompanying drawings, in which:

FIG. 1 shows a flow diagram of a method for producing a silicon carbide component;

DETAILED DESCRIPTION

Figure 2A:
FIGS. 2a-2e show schematic cross sections of a silicon carbide component at different stages during the production of the silicon carbide component.

Various exemplary embodiments will now be described more thoroughly with reference to the accompanying drawings, in which some exemplary embodiments are illustrated. In the figures, the thickness of the lines, layers and/or regions may be exaggerated for the sake of clarity.

While further examples are correspondingly suitable for various modifications and alternative forms, some examples thereof are shown by way of example in the figures and are described thoroughly here. It goes without saying, however, that the intention is not to limit examples to the specific forms disclosed. Further examples can cover all modifications, counterparts and alternatives that fall within the scope of the disclosure. Throughout the description of the figures, identical reference signs refer to identical or similar elements which can be implemented identically or in modified form in comparison with one another, while they provide the same or a similar functionality.

It goes without saying that if one element is designated as "connected" or "coupled" to another element, the elements can be connected or coupled directly or via one or more intermediate elements. If two elements A and B are linked by an "or", this is intended to be understood such that it discloses all possible combinations, i.e. only A, only B, and A and B. An alternative wording for the same combinations is "at least one from A and B". The same applies to combinations of more than 2 elements.

If here and hereinafter a first component part (e.g. a layer) is formed "on" a second component part (e.g. a further layer or a wafer), then it is possible for the first component part to be applied directly on the second component part or for at least one third component part to be situated between the first component part and the second component part.

The terminology used herein is intended to describe specific examples and is not intended to have a limiting effect for further examples. Whenever a singular form such as "a, an" and "the" is used and the use of only one element is defined neither explicitly nor implicitly as obligatory, further examples can also encompass the plural forms in order to implement the same functionality. In a similar way, if a functionality is described below such that it is implemented using a plurality of elements, further examples can implement the same functionality using a single element or processing entity. Furthermore, it goes without saying that the terms "comprises", "comprising", "have" and/or "having" in the usage herein indicate the presence of indicated features, integers, steps, operations, elements and/or constituents, but do not exclude the presence or addition of one or more other features, integers, steps, operations, elements, constituents and/or groups thereof Unless defined otherwise, all terms used here (including technical and scientific terms) are used in their customary meaning with which the examples are associated.

FIG. 1 shows a flow diagram of a method for producing a silicon carbide component corresponding to one exemplary embodiment. The method 100 comprises forming 110 a silicon carbide layer on an initial wafer, forming 120 a doping region of the silicon carbide component to be produced in the silicon carbide layer, and forming 130 an electrically conductive contact structure of the silicon carbide component to be produced on a surface of the silicon carbide layer. The electrically conductive contact structure electrically contacts the doping region. Furthermore, the method 100 comprises splitting 140 the silicon carbide layer or the initial wafer after forming the electrically conductive contact structure, such that a silicon carbide substrate at least of the silicon carbide component to be produced is split off.

By producing structures of the silicon carbide component already before the silicon carbide substrate of the silicon carbide component is split off, the complexity of the production process could be reduced and/or the handling of the wafer during production could be simplified since the thin silicon carbide substrate of the silicon carbide component is not split off until later in the process. As a result, the production costs could be reduced and/or the yield could be increased. Furthermore, if a sufficient thickness of the silicon carbide layer formed were chosen, the initial wafer could be reused multiply. As a result, the costs could be reduced.

The initial wafer (or start wafer or starting wafer) can be a silicon carbide wafer or have a surface formed by silicon carbide having a sufficiently low crystal defect density to enable the process of forming 110 the silicon carbide layer with desired quality. The initial wafer can have a thickness of more than 200 μm (or more than 300 μm or more than 500 μm). The initial wafer can have a diameter of more than 80 mm (or more than 130 mm or more than 180 mm). The initial wafer can have a doping concentration of at least $1*10^{17}$ cm$^{-3}$ or $5*10^{17}$ cm$^{-3}$ (so-called "doped initial wafer"). Alternatively, the initial wafer can be not intentionally doped (so-called "nominally undoped" wafer), wherein a doping concentration of the initial wafer in this case can be at most $1*10^{17}$ cm$^3$. The doping type of the initial wafer can be an n-type.

The silicon carbide layer can be formed 110 for example by epitaxial growth on a surface of the initial wafer. The silicon carbide layer can accordingly be an epitaxial silicon carbide layer. As early as during growth, the silicon carbide layer can be provided with a homogenous or vertically varying basic doping (n-type doping or p-type doping). By way of example, the silicon carbide layer can be formed on a silicon crystal face (silicon face) of the silicon carbide of the initial wafer, such that the surface of the silicon carbide layer formed is likewise a silicon crystal face (i.e. terminates with silicon atoms). As a result, the doping of the silicon carbide layer could be controlled and produced with high accuracy during the growth of the silicon carbide layer. Alternatively, the surface of the silicon carbide layer formed can be a carbon crystal face (carbon face). The silicon carbide layer formed can have for example a thickness of more than 10 μm (or more than 20 μm or more than 30 μm or more than 60 μm or more than 100 μm) and/or less than 300 μm (or less than 150 μm or less than 80 μm). The silicon carbide layer is formed for example on the entire surface of the initial wafer.

The silicon carbide layer formed can be thicker than is required for the provision of a sufficient electrical breakdown strength. By way of example, a silicon carbide layer of an alternative silicon carbide component in which only the breakdown strength has to be ensured on the basis of the silicon carbide layer can have a thickness of at least 5 μm for a voltage class of 650 V (at least 9 μm for 1200 V and at least 25 μm for 3.3 kV). In comparison therewith, in exemplary embodiments of a silicon carbide component described here, the silicon carbide layer can have a thickness of at least 20 μm for a voltage class of 650 V (at least 40 μm for 1200 V and at least 50 μm for 3.3 kV).

The doping region of the silicon carbide component to be produced can be formed 120 by ion implantation or during the process of forming 110 the silicon carbide layer. The doping region can be an n-doped doping region or a p-doped doping region at the surface of the silicon carbide layer. Furthermore, the doping region can be for example an anode region or cathode region of a diode or a source region, a body region, a drain region, an emitter region or a collector region of a transistor. The doping region has for example a pn junction with an adjacent part of the silicon carbide layer.

The electrically conductive contact structure serves to electrically contact the doping region. The electrically conductive contact structure can extend for example over one or more planes or layers of a wiring layer stack of the silicon carbide component from the doping region to a further doping region of the silicon carbide component, which is implemented in the silicon carbide layer, or to a connection pad or a connection metallization (e.g. power metal layer, power metallization) of the silicon carbide component or form a connection pad or a connection metallization. By way of example, the electrically conductive contact structure can comprise a via or an electrically conductive partial structure in a contact hole, which contact the doping region. The electrically conductive contact structure can comprise for example one or more metals (e.g. copper, aluminium, tungsten) or a combination of a plurality of metal layers and/or polysilicon (e.g. highly doped polysilicon). One part of the electrically conductive contact structure is formed directly on the surface of the silicon carbide layer and is thereby in contact with the surface of the silicon carbide layer. One or more other parts of the electrically conductive contact structure can however also be formed (not directly) on the surface of the silicon carbide layer with one or more electrically insulating layers vertically between the surface of the silicon carbide layer and the one or more other parts. By way of example, the electrically conductive contact structure is in ohmic contact with the doping region.

The splitting 140 can be carried out at a desired depth below the surface of the silicon carbide layer, such that a silicon carbide substrate 270 with one or more silicon carbide component structures having a sufficient or desired thickness is split off. The splitting 140 can be carried out along a splitting region in the silicon carbide layer or in the initial wafer, which splitting region extends parallel to the surface of the silicon carbide layer. If the splitting 140 is carried out within the silicon carbide layer formed, the initial wafer can be reused completely for the production of further components. The initial wafer can then be reused many times; the costs for a basic material wafer can be significantly reduced. By way of example, the splitting 140 is carried out by splitting the silicon carbide layer, such that a part of the silicon carbide layer remains on the initial wafer after splitting 140. The remaining part of the silicon carbide layer on the initial wafer can then be removed for example at least partly during a reconditioning of the surface. Alternatively, the splitting 140 can be carried out in the region of the initial wafer, as a result of which, however, the initial wafer loses thickness and cannot be reused arbitrarily often.

The splitting 140 is carried out after forming 130 the electrically conductive contact structure and optionally after forming further structures on the surface of the silicon carbide layer and in the silicon carbide layer. By way of example, the surface of the silicon carbide layer forms a front side surface for the silicon carbide component to be produced. In this example, many or all front side structures (e.g. including passivation layer) of the silicon carbide component can already be produced before the silicon carbide layer or the initial wafer is split 140. By way of example, a wiring layer stack (e.g. which comprises the electrically conductive contact structure), a metallization structure composed of one or more metal layers and/or a passivation layer (e.g. organic material layer, such as polyimides, for example) can be formed on the surface of the silicon carbide layer before the splitting 140. Optionally, before the splitting 140, further structures (e.g. gates of transistors, wiring structures, electric pads and/or edge termination structures) of the silicon carbide component can be produced at the surface or in the silicon carbide layer. Customary production methods can be employed. The optional passivation layer is formed for example after the electrically conductive contact structure. The passivation layer can extend for example over the entire surface of the silicon carbide layer with the exception of one or more connection pad openings.

The splitting 140 can be carried out in various ways. By way of example, after forming 110 the silicon carbide layer in preparation for the splitting 140 as early as before forming 130 the electrically conductive contact structure, a laser treatment of a splitting region at which the splitting 140 is intended to be carried out later can be carried out in order to pre-damage the splitting region for the splitting 140 (e.g. by producing microcracks by means of the laser bombardment). By way of example, all processes between the laser treatment of the splitting region for pre-damage and the splitting 140 could be carried out at temperatures below 400° C., with the result that an uncontrolled intensification of the pre-damage can be avoided. The laser bombardment can be carried out for example after a process of structuring the silicon carbide layer (e.g. for the purpose of producing gate trenches) and before a metal layer is produced. The splitting 140 can then be carried out along the pre-damaged splitting region by applying a polymer film and producing thermal stress (e.g. cold split method). As a result, the space requirement for the splitting 140 could be kept small, with the result that little of the silicon carbide layer is lost and the conditioning of the initial carrier is not as complex. The splitting 140 can also be carried out by means of a second laser treatment, wherein laser light of the second laser treatment is absorbed in the pre-damaged regions.

Alternatively or additionally, the splitting 140 can comprise for example implanting ions (e.g. H, He, N, V, B, Ar, C, Ni, Si, Ti, Ta, Mo, W and/or Al). It is possible for a pre-damaged splitting region to be produced in the initial wafer or in the silicon carbide layer by means of the ion implantation. In the case of implantation into the initial wafer, the ions can be implanted into the initial wafer before the silicon carbide layer is formed, e.g. proceeding from that surface of the initial wafer at which the silicon carbide layer is produced. In the case of implantation into the silicon carbide layer, the ions can be implanted into the silicon carbide layer after the latter has been formed, for example proceeding from a side of the silicon carbide layer facing away from the initial wafer. It is also possible for forming the silicon carbide layer to comprise forming a first partial layer and at least one second partial layer, wherein firstly the first partial layer is formed on the initial wafer and the ions are implanted into the first partial layer before the second partial layer is formed on the first partial layer.

The splitting region can be a thin layer within the silicon carbide layer or within the initial wafer. The thickness of the splitting region can be small relative to the total thickness of the initial wafer or of the silicon carbide layer. A thickness of the splitting region can be at least 30 nm (typically at least 100 nm) and at most 1.5 µm (typically at most 500 nm).

The implantation of ions (in particular of N, V, B, Ar, C, Ni, Si, Ti, Ta, Mo, W and/or Al) can lead to damage to the crystal structure in the region of the splitting region (so-called "pre-damaged splitting region"). By way of example, the polytype of the silicon carbide in the region of the splitting region can change at least partly, e.g. from previously 4H—SiC to subsequently 3C—SiC. The damage to the crystal structure can lead to an increased absorption of electromagnetic radiation within a known wavelength range in comparison with the non-damaged regions of the initial wafer (and/or of the silicon carbide layer) outside the splitting region. Within the splitting region, the initial wafer (or the silicon carbide layer) can have a smaller band gap than in non-damaged regions outside the splitting region. By way of example, the absorption coefficient in the known wavelength range within the splitting region is at least 5 times (or at least 20 times or at least 100 times) the absorption coefficient in the non-damaged regions. It is thus possible for electromagnetic radiation (e.g. laser radiation) having an emission in the known wavelength range to be absorbed to a greater extent in the splitting region. The known wavelength range can be in a range of e.g. at least 200 nm and at most 1500 nm, typically at least 300 nm and at most 600 nm.

The splitting 140 can furthermore alternatively or additionally comprise a laser bombardment into a pre-damaged or non-pre-damaged splitting region in the silicon carbide layer or the initial wafer. In the case of a non-pre-damaged splitting region, the splitting region can be defined by focusing of the laser radiation of the laser bombardment at the desired location of the splitting region. A non-pre-damaged splitting region can be a region of the initial wafer (or of the silicon carbide layer) which does not differ from regions outside the splitting region (that is to say has e.g. the same crystal structure and the same material composition). Alternatively, the non-pre-damaged splitting region can be a layer of a different material or of a different crystal structure that is introduced into the initial wafer (or the silicon carbide layer), with no damage being carried out by means of implantation.

The laser bombardment can be carried out proceeding from a side of the initial wafer facing away from the silicon carbide layer. The laser bombardment makes it possible for thermomechanical stress to be induced within the splitting region, thereby facilitating or enabling the splitting 140 along the splitting region. After the laser bombardment, it is possible to split the initial wafer (or the silicon carbide layer) along the splitting region, optionally with the aid of additional mechanical force.

In the case of a pre-damaged splitting region, the wavelength of the laser radiation can be chosen in such a way that the corresponding photon energy of the laser radiation is at least 1/10 and at most 10 times the band gap in the splitting region. This can lead to a dominance of single-photon processes within the splitting region.

In the case of a non-pre-damaged splitting region, it is possible for the wavelength of the laser radiation to be chosen in such a way that the probability of single-photon processes is vanishingly low in comparison with multi-photon processes. By way of example, the band gap in the splitting region is then at least 2 times (typically at least 10 times) the corresponding photon energy of the laser radiation.

If the splitting 140 is carried out by one of the laser-assisted methods described above at a splitting region in the initial wafer, it is possible for the initial wafer to be undoped, that is to say not intentionally doped. An undoped initial wafer can have a higher transmission than a doped initial wafer for laser radiation in the known wavelength range. As a result, it can be possible to avoid a jump in the absorption coefficient upon transition from regions outside the splitting region, as a result of which for example readjustment of a focus of the laser radiation can be avoided.

As a result of the splitting 140, it is possible to obtain a silicon carbide substrate 270 (e.g. silicon carbide wafer) on which one silicon carbide component or a plurality of silicon carbide components can be obtained simultaneously depending on the size of the silicon carbide component to be produced or the silicon carbide components to be produced. Therefore, the silicon carbide substrate 270 forms a semiconductor substrate at least of the silicon carbide component to be produced or of a plurality of silicon carbide components to be produced. The silicon carbide substrate can have for example a thickness of more than 30 μm (or more than 60 μm or more than 100 μm) and/or less than 300 μm (or less than 150 μm or less than 80 μm).

If a plurality of silicon carbide components are produced at the silicon carbide layer then the silicon carbide layer can be separated (e.g. by sawing or laser cutting) already before the splitting 140 in regions (e.g. sawing frame) between the silicon carbide components. By way of example, the silicon carbide layer can be cut down to a depth at which the splitting 140 is intended to be carried out. As a result, the silicon carbide components could also be singulated automatically during the splitting 140. Alternatively, the silicon carbide components could be singulated after the splitting 140 and optionally also after a rear side metallization has been produced.

Before the splitting 140, a carrier wafer (e.g. glass wafer) or a carrier film (e.g. polymer film) can be secured to a layer stack formed on the surface of the silicon carbide layer (and comprising for example at least the electrically conductive contact structure). The carrier wafer or the carrier film can enable simple and secure handling of the silicon carbide substrate 270 after splitting off.

In order to enable splitting 140 within the silicon carbide layer and a reuse of the initial wafer without loss of material at the initial wafer, the thickness of the silicon carbide layer can be chosen to be greater than is actually necessary for the silicon carbide component to be produced (e.g. for achieving the desired blocking capability). Optionally, the surface of the wafer 270 remaining after the splitting 140 can be reconditioned before further production of silicon carbide components. In order to minimize additional ohmic losses as a result of the thicker silicon carbide layer during operation of the silicon carbide component, the additional part of the silicon carbide layer can be highly doped.

By way of example, forming 110 the silicon carbide layer can comprise forming a first partial layer of the silicon carbide layer with an average doping concentration (and/or a maximum doping concentration) of more than $5*10^{17}$ cm$^{-3}$ (or more than $5*10^{18}$ cm$^{-3}$ or more than $1*10^{19}$ cm$^{-3}$) and forming a second partial layer of the silicon carbide layer with an average doping concentration (and/or a maximum doping concentration) of less than $1*10^{17}$ cm$^{-3}$ (or less than $5*10^{16}$ cm$^{-3}$ or less than $1*10^{16}$ cm$^{-3}$). The average doping concentration corresponds for example in each case to a doping concentration averaged over the respective partial layer. The first partial layer and the second partial layer can be epitaxially grown successively, for example. The first partial layer can be grown directly on the initial wafer and the second partial layer can be grown directly on the first partial layer. The thickness of the first partial layer of the silicon carbide layer can be for example greater than 20 μm (or greater than 40 μm or greater than 80 μm), such that the splitting 140 can be carried out within the first partial layer without impairing the second partial layer and the initial wafer. The thickness of the second partial layer of the silicon carbide layer can be less than 30 μm (or less than 20 μm or less than 10 μm). The thickness of the second partial layer of the silicon carbide layer can be chosen for example depending on the blocking capability to be achieved for the silicon carbide component to be produced. By way of example, the second partial layer can be used to form a drift region of the silicon carbide component to be produced. By way of example, the thickness of the second partial layer of the silicon carbide layer is smaller (e.g. more than 10 μm) than the thickness of the first partial layer of the silicon carbide layer.

The silicon carbide layer mentioned above is merely by way of example and can be modified depending on the component to be produced. By way of example, the silicon carbide layer can comprise more than two partial layers having different doping concentrations and/or different doping types.

After the splitting 140, by way of example, a surface of a remaining wafer 270, which comprises a part of the silicon carbide layer on the initial wafer, can be conditioned for the production of further silicon carbide components. Alternatively, the remaining wafer 270 only comprises at least one part of the initial wafer if the splitting 140 is carried out at the boundary between initial wafer and silicon carbide layer or in the initial wafer. The method 100 can thus optionally comprise conditioning a surface of a remaining wafer 270, comprising at least one part of the initial wafer, after the splitting 140. The conditioning of the surface of the remaining wafer 270, which can also be referred to as a reclaim process, can be carried out for example by means of grinding, polishing, plasma-chemical dry etching, chemical mechanical polishing (CMP) and/or lapping. The loss of material during conditioning and the costs associated therewith can be minimized for example by using a cold split method.

Afterwards, one or more further silicon carbide components could be produced on the remaining wafer 270. By way of example, a further silicon carbide layer can be formed on the remaining wafer 270 and a doping region of a further silicon carbide component to be produced can be formed in the further silicon carbide layer. Furthermore, splitting the further silicon carbide layer or the remaining wafer 270 could be carried out after forming the doping region of the further silicon carbide component to be produced such that a further silicon carbide substrate at least of the further silicon carbide component to be produced is split off.

By way of example, the vertical direction and a vertical dimension or thicknesses of layers can be measured orthogonally with respect to a front side surface of the silicon carbide substrate of the silicon carbide component (e.g. surface of the silicon carbide layer) and a lateral direction and lateral dimensions can be measured parallel to the front side surface of the silicon carbide substrate of the silicon carbide component.

The front side (or front side surface) of the silicon carbide substrate of the silicon carbide component can be the side (or surface) which is used for implementing more complex structures (e.g. gates of transistors) than at the rear side of the semiconductor wafer, since the process parameters (e.g. temperature) and the handling and/or usable processes for the rear side can be restricted if structures have already been formed at a side of the semiconductor wafer.

By way of example, the silicon carbide component can be a vertical silicon carbide component or comprise a vertical component structure (e.g. vertical diode, vertical field effect transistor or vertical insulated gate bipolar transistor IGBT). A vertical silicon carbide component or a vertical component structure conducts for example current in a conducting state or an on state principally (e.g. more than 70% of a total current through the silicon carbide component) vertically between a front side and a rear side. The silicon carbide component can be a power semiconductor component. By way of example, the silicon carbide component and/or a vertical component structure of the silicon carbide component can have a breakdown voltage or reverse voltage of more than 100 V (e.g. a breakdown voltage of 200 V, 300 V, 400 V or 500 V), more than 500 V (e.g. a breakdown voltage of 600 V, 700 V, 800 V or 1000 V) or more than 1000 V (e.g. a breakdown voltage of 1200 V, 1500 V, 1700 V, 2000 V, 3300 V or 6500 V).

FIGS. 2a to 2e show schematic cross sections of a silicon carbide component at different stages during the production of the silicon carbide component corresponding to one exemplary embodiment.

Figure 2B:
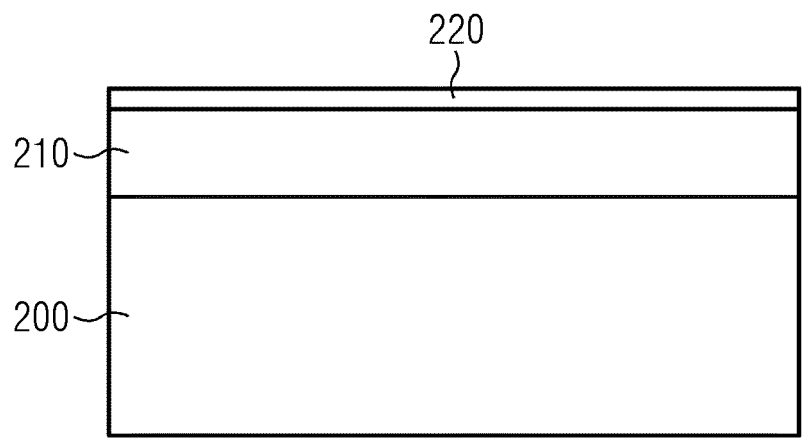

FIG. 2a shows a silicon carbide initial wafer 200 (e.g. having a thickness of 350 µm), on which a silicon carbide layer is grown epitaxially, as shown in FIG. 2b. The silicon carbide layer comprises a highly n-doped (n+) buffer layer 210 and a drift layer 220 (e.g. having a thickness of between 3 µm and 20 µm). The silicon carbide layer has for example a thickness of more than 50 µm. The n-doped (n+) buffer layer 210 can have for example an average doping concentration (and/or a maximum doping concentration) of more than $5*10^{17}$ cm$^{-3}$ (or more than $5*10^{18}$ cm$^{-3}$ or more than $1*10^{19}$ cm$^{-3}$) and the drift layer 220 can have an average doping concentration (and/or a maximum doping concentration) of less than $1*10^{17}$ cm$^{-3}$ (or less than $5*10^{16}$ cm$^{-3}$ or less than $1*10^{16}$ cm$^{-3}$).

The total thickness of the epitaxial layer (silicon carbide layer) can depend for example on the desired blocking capability of the component and on the minimum possible layer thickness (e.g. approximately 50 µm) split off by the splitting method chosen and the material (e.g. approximately 10 µm) lost in the regeneration process (reclaim process), in order that a wafer having approximately the initial thickness is available again after the reclaim process. If this is not completely the case (e.g. if the wafer becomes somewhat thinner with each pass as a result of splitting oft), the method is still applicable, although process adaptations might be necessary and the risk of fracture might increase.

By way of example, in the case of this additional epitaxial layer thickness which is not required electrically (for the silicon carbide component), a sufficient doping can be present which has no appreciable (<10%) influence on the total conductivity of the resulting vertical component (e.g. Schottky diode, pn diode, junction field effect transistor JFET, metal oxide semiconductor field effect transistor MOSFET). Since the homogeneity may be of secondary importance, for example, a highly cost-effective epitaxy process could be employed.

Figure 2C:
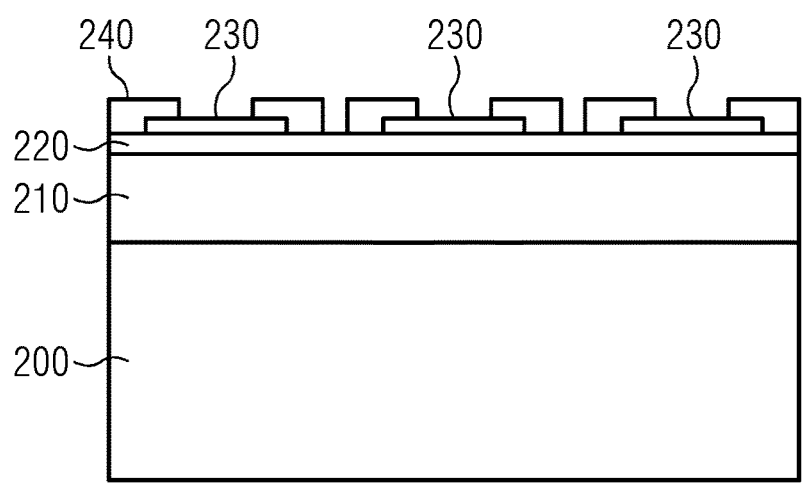

After the process of forming the silicon carbide layer, a plurality of component structures (e.g. doping regions and/or wiring layer stacks) can be produced at and/or in the silicon carbide layer, as is shown in FIG. 2c. Inter alia, connection pads 230 and a passivation layer 240 of one or more silicon carbide components to be produced are shown in this example.

Figure 2D:
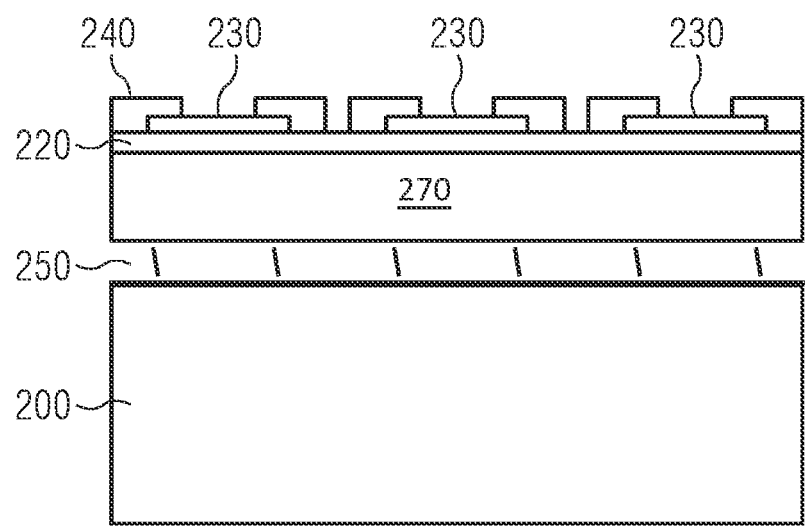

Instead of thinning (e.g. by grinding) from the rear side, the silicon carbide layer can be split along a splitting region 250, as is shown in FIG. 2d, in order to obtain the silicon carbide initial wafer 200 for a further use.

Various processes could be used for the splitting, said processes for example also being used for reducing the SiC substrate costs, thereby enabling for example a loss of material of less than 15 µm. By contrast, the loss of material would be significantly higher in the case of filament sawing. By way of example, pre-damage can be produced in the splitting region by laser bombardment and later the wafer can be coated with a polymer film and then thermally stressed. As a result of different thermal properties of wafer and polymer, the wafer can be split into two parts. Alternatively or in a supporting manner, the wafer can be split by means of a laser, for example.

Figure 2E:
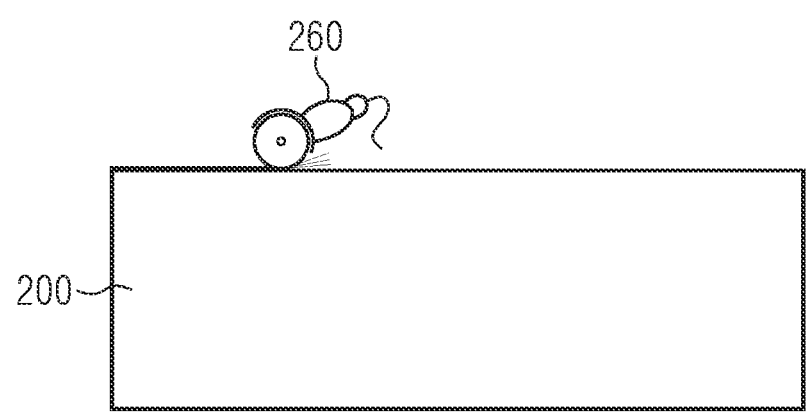

After the splitting, the split surface of the remaining wafer 270 can be lapped and/or polished 260, for example, for the purpose of regeneration (reclaim), as is shown in FIG. 2e, in order to prepare said surface for epitaxy again. After the last mechanical processing step (e.g. roughness depth <2 nm), a dry etching process can additionally be employed to remove buried crystal defects surface-conformally before the next epitaxy step.

FIGS. 2a to 2e show by way of example a wafer regeneration process on the basis of splitting a wafer. The wafer can be reused at least ten times for example on the basis of the proposed method.

Further details and aspects are mentioned in conjunction with the exemplary embodiments described above or below. The exemplary embodiment shown in FIGS. 2a-2e can have one or more optional additional features which correspond to one or more aspects which are mentioned in conjunction with the proposed concept or one or more exemplary embodiments described above (e.g. FIG. 1) or below (e.g. FIGS. 3-4).

Figure 3:
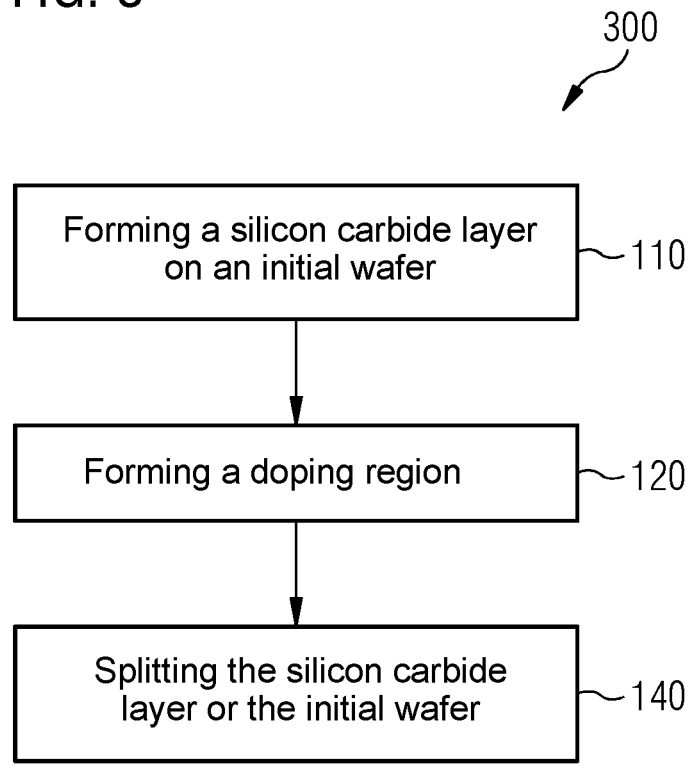
FIG. 3 shows a flow diagram of a method for producing a silicon carbide component.

FIG. 3 shows a flow diagram of a method for producing a silicon carbide component corresponding to one exemplary embodiment. The method 300 comprises forming 110 a silicon carbide layer on an initial wafer, forming 120 a doping region of the silicon carbide component to be produced in the silicon carbide layer, and splitting 140 the silicon carbide layer or the initial wafer after forming 120 the doping region, such that a silicon carbide substrate at least of the silicon carbide component to be produced is split off. Furthermore, the silicon carbide substrate has a thickness of more than 30 µm (or more than 60 µm or more than 100 µm).

Reuse of the initial wafer can be made possible by forming a silicon carbide layer having a sufficient thickness. The costs for producing silicon carbide components could be reduced as a result.

Further details and aspects are mentioned in conjunction with the exemplary embodiments described above or below. The exemplary embodiment shown in FIG. 3 can have one or more optional additional features which correspond to one or more aspects which are mentioned in conjunction with the proposed concept or one or more exemplary embodiments described above (e.g. FIGS. 1-2e) or below (e.g. FIG. 4).

Figure 4:
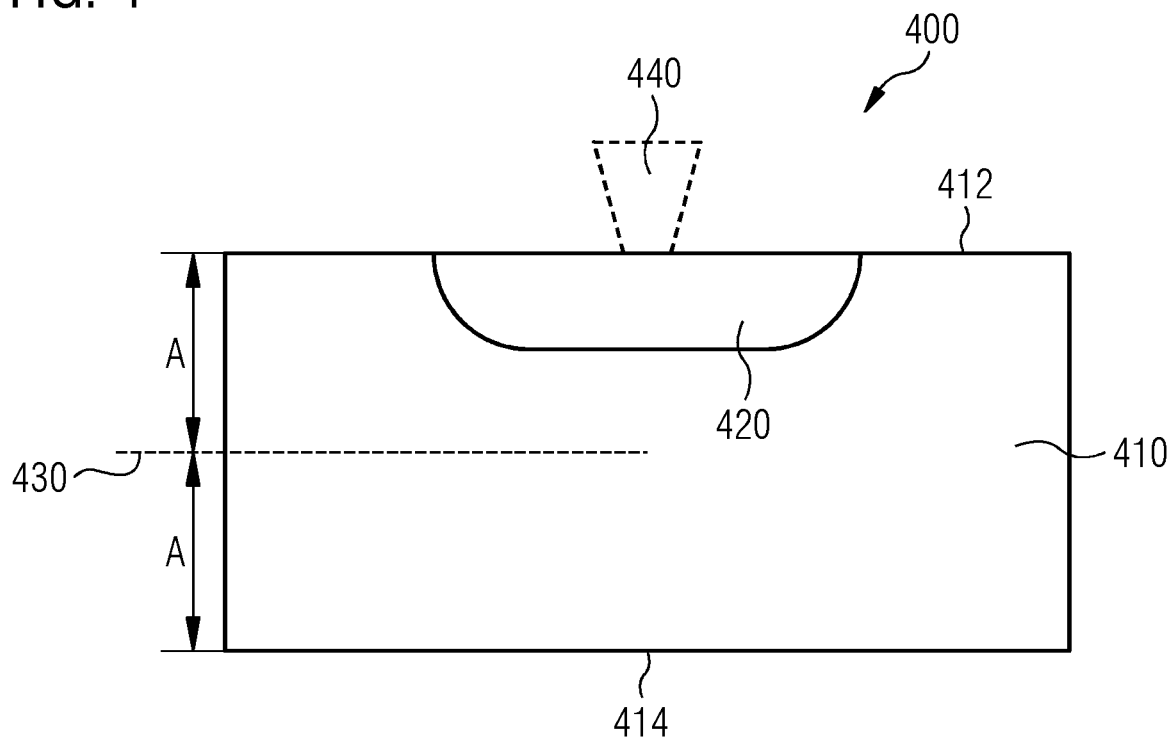
FIG. 4 shows a schematic cross section of a part of a silicon carbide component.

FIG. 4 shows a schematic cross section of a part of a silicon carbide component corresponding to one exemplary embodiment. The silicon carbide component 400 comprises a silicon carbide substrate 410 having a thickness of more than 30 μm and a doping region 420 of the silicon carbide component 400 arranged at a first surface 412 of the silicon carbide substrate 410. A point defect density in the centre 430 of the silicon carbide substrate 410 between the first surface 412 and an opposite second surface 414 of the silicon carbide substrate 410 is less than $5*10^{14}$ cm$^{-3}$ (or less than $1*10^{14}$ cm$^{-3}$ or less than $5*10^{13}$ cm$^{-3}$), since the SiC substrate was produced by means of an epitaxial process at temperatures of less than 1700° C., for example, and the equilibrium point defect concentration established is thus different (lower) compared with that established during the bulk crystal growth process by means of sublimation at ~2300° C.

If a silicon carbide component is formed on a thick epitaxial silicon carbide layer (which was grown beforehand on an initial wafer, for example), the point defect density even in the centre of the silicon carbide substrate of the silicon carbide component can be kept low. Furthermore, the costs for production could be reduced by the use of a thick silicon carbide substrate.

The point defect density can be measured for example at a point or in a plane which is at the same distance A from the first surface 412 and from the second surface 414 of the silicon carbide substrate 410 and thereby corresponds to the centre 430.

By way of example, furthermore, an average doping concentration in the centre 430 of the silicon carbide substrate 410 can be greater than $5*10^{17}$ cm$^{-3}$ (or more than $5*10^{18}$ cm$^{-3}$ or more than $1*10^{19}$ cm$^3$). By way of example, the silicon carbide substrate 410 can comprise a first partial layer having an average doping concentration (and/or a maximum doping concentration) of more than $5*10^{17}$ cm$^{-3}$ (or more than $5*10^{18}$ cm$^{-3}$ or more than $1*10^{19}$ cm$^{-3}$) and a second partial layer having an average doping concentration (and/or a maximum doping concentration) of less than $1*10^{17}$ cm$^{-3}$ (or less than $5*10^{16}$ cm$^{-3}$ or less than $1*10^{16}$ cm$^{-3}$). The thickness of the first partial layer of the silicon carbide substrate can be for example greater than 20 μm (or greater than 40 μm or greater than 80 μm). The thickness of the second partial layer of the silicon carbide substrate can be less than 30 μm (or less than 20 μm or less than 10 μm). The thickness of the second partial layer of the silicon carbide substrate can be chosen for example depending on the blocking capability to be achieved for the silicon carbide component to be produced. By way of example, at least one part of the first partial layer can form a drift region of the silicon carbide component 400. By way of example, the thickness of the second partial layer of the silicon carbide substrate is smaller (e.g. more than 10 μm) than the thickness of the first partial layer of the silicon carbide substrate.

The silicon carbide component 400 can be produced for example by one of the methods described in association with FIGS. 1-3. A silicon carbide component produced can have a low point defect density even in the centre of the silicon carbide substrate of the silicon carbide component.

By way of example, the silicon carbide component 400 can be a vertical silicon carbide component or comprise a vertical component structure (e.g. vertical diode, vertical field effect transistor or vertical insulated gate bipolar transistor IGBT). A vertical silicon carbide component or a vertical component structure conducts for example current in a conducting state or an on state principally (e.g. more than 70% of a total current through the silicon carbide component) vertically between a front side and a rear side. The silicon carbide component can be a power semiconductor component. By way of example, the silicon carbide component and/or a vertical component structure of the silicon carbide component can have a breakdown voltage or reverse voltage of more than 100 V (e.g. a breakdown voltage of 200 V, 300 V, 400 V or 500 V), more than 500 V (e.g. a breakdown voltage of 600 V, 700 V, 800 V or 1000 V) or more than 1000 V (e.g. a breakdown voltage of 1200 V, 1500 V, 1700 V, 2000 V, 3300 V or 6500 V).

Further details and aspects are mentioned in conjunction with the exemplary embodiments described above or below. The exemplary embodiment shown in FIG. 4 can have one or more optional additional features which correspond to one or more aspects which are mentioned in conjunction with the proposed concept or one or more exemplary embodiments described above (e.g. FIGS. 1-3) or below.

Some exemplary embodiments relate to a SiC wafer recycling method.

In alternative methods, by way of example, the SiC basic material costs can be reduced by a very thin layer (in the region of e.g. <=1 μm) being split off from a wafer and being bonded onto an auxiliary carrier. An optimally adapted surface can thus be available for the subsequent epitaxy process, without a complete wafer having to be used for this purpose. However, a complex process of splitting (e.g. smart cut) and bonding may be necessary in this method. In particular the wafer bow of such a composite wafer could be very high even with good matching of the temperature coefficient CT (with the use e.g. of graphite carriers) and the process compatibility of the carrier could be critical. In another method, monocrystalline SiC layers could be electrically conductively bonded on a poly-SiC wafer. Thus, although the bow topic and also the process compatibility could be significantly improved, for example almost no cost advantage would arise in comparison with the monocrystalline SiC substrate.

According to the proposed concept, the splitting off can be performed for example only after the complete front side processing of the respective components and the highly doped wafer split off can be used again after a suitable regeneration step (reclaim step). In order for example always to start with the same (or similar) wafer thickness in the process, it is possible to apply an epitaxial layer whose total thickness does not depend (exclusively) on the electrical requirements of the component that results later, but rather concomitantly includes as minimum thickness the material margin necessary for the splitting process. Said material margin can be highly coped in order not to generate any appreciable ohmic additional resistance in the later component. A sufficiently thick epitaxial layer together with a splitting process can allow a wafer reclaim during SiC component production. By way of example the wafer is not consumed in the process, but rather can be a recoverable constituent. By way of example, it is possible to carry out splitting of SiC wafers having a thickness of 150 μm and a diameter of 150 mm or some other thickness and/or diameter.

The split-off partial wafer 270 with the component structures can be processed to completion to the greatest possible extent on the front side in order for example to minimize the handling steps of this thin and hence fragile partial wafer. The split-off partial wafer can be provided at least with a contact layer and a contact reinforcement for the mounting capability. By way of example, a thin nickel silicide NiSi layer can be sputtered onto the rear side of the wafer and thermal contact formation can be carried out by means of rapid thermal processing (RTP) or laser pulses. A solderable rear-side metal layer can then be deposited.

The aspects and features that have been mentioned and described together with one or more of the examples and figures described in detail above can furthermore be combined with one or more of the other examples in order to replace a similar feature of the other example or in order additionally to introduce the feature into the other example.

The description and drawings present only the principles of the disclosure. Furthermore, all examples mentioned here are intended to be used expressly only for teaching purposes, in order to assist the reader in understanding the principles of the disclosure and the concepts contributed by the inventor(s) for further development of the art. All statements herein regarding principles, aspects and exemplary embodiments of the disclosure and also particular exemplary embodiments thereof are intended to encompass the counterparts thereof.

A block diagram can illustrate e.g. a detailed circuit diagram which implements the principles of the disclosure. In a similar manner, a flow diagram, flow chart, state transition diagram, pseudo-code and the like can illustrate various processes which can substantially be represented in a computer-readable medium and thus be performed by a computer or processor, regardless of whether such a computer or processor is expressly illustrated. Methods disclosed in the description or in the claims can be implemented by a device comprising means for performing each of the corresponding steps of said methods.

Furthermore, it goes without saying that the disclosure of multiple steps, processes, operations, sequences or functions disclosed in the description or the claims should not be interpreted as being in the specific order, unless this is explicitly or implicitly indicated otherwise, e.g. for technical reasons. The disclosure of multiple steps or functions therefore does not limit them to a specific order, unless said steps or functions are not interchangeable for technical reasons. Furthermore, in some examples, an individual step, function, process or sequence can include a plurality of partial steps, functions, processes or sequences or be subdivided into them. Such partial steps can be included and be part of the disclosure of said individual step, provided that they are not expressly excluded.

Furthermore, the claims that follow are hereby incorporated in the detailed description, where each claim can be representative of a separate example by itself. If each claim can be representative of a separate example by itself, it should be taken into consideration that—although a dependent claim can refer in the claims to a particular combination with one or more other claims—other exemplary embodiments can also include a combination of the dependent claim with the subject matter of any other dependent or independent claim. These combinations are proposed here, provided that no indication is given that a specific combination is not intended. Furthermore, features of a claim are intended also to be included for any other independent claim, even if this claim is not made directly dependent on the independent claim.

The invention claimed is:

1. A method for producing a silicon carbide component, the method comprising:
forming a silicon carbide layer on an initial wafer;
forming a doping region of the silicon carbide component to be produced in the silicon carbide layer;
forming an electrically conductive contact structure on the surface of the silicon carbide layer, the electrically conductive contact structure electrically contacting the doping region,
producing a splitting region by pre-damaging the splitting region, wherein the splitting region is produced by laser treating the splitting region before forming the electrically conductive contact structure in order to pre-damage the splitting region;
splitting the silicon carbide layer or the initial wafer along the splitting region after forming the doping region, such that a silicon carbide substrate at least of the silicon carbide component to be produced is split off, wherein the silicon carbide substrate has a thickness of more than 30 μm,
wherein the doping region is formed to extend to a surface of the silicon carbide layer before splitting the silicon carbide layer, and
wherein splitting along the splitting region comprises applying a polymer film.

2. The method of claim 1, wherein at least one surface of the initial wafer comprises silicon carbide, and wherein forming the silicon carbide layer comprises epitaxially growing silicon carbide on the surface of the initial wafer.

3. The method of claim 1, wherein forming the silicon carbide layer comprises:
forming a first partial layer of the silicon carbide layer with an average doping concentration of more than 5*1017 cm-3; and
forming a second partial layer of the silicon carbide layer with an average doping concentration of less than 1*1017 cm-3.

4. The method of claim 3, wherein the thickness of the first partial layer of the silicon carbide layer is greater than 20 μm.

5. The method of claim 3, wherein the thickness of the second partial layer of the silicon carbide layer is less than 30 μm.

6. The method of claim 3, wherein the thickness of the second partial layer of the silicon carbide layer is less than the thickness of the first partial layer of the silicon carbide layer.

7. The method of claim 3, wherein at least one part of the second partial layer forms a drift region of the silicon carbide component to be produced.

8. The method of claim 1, further comprising:
forming a passivation layer on the surface of the silicon carbide layer before the splitting.

9. The method of claim 1, further comprising:
securing a carrier wafer or a carrier film to a layer stack formed on the surface of the silicon carbide layer, before the splitting.

10. The method of claim 1, further comprising:
conditioning a surface of a remaining wafer, comprising at least one part of the initial wafer, after the splitting.

11. The method of claim 10, further comprising:
forming a further silicon carbide layer on the remaining wafer;
forming a doping region of a further silicon carbide component to be produced in the further silicon carbide layer; and
splitting the further silicon carbide layer or the remaining wafer after forming the doping region of the further silicon carbide component to be produced, such that a further silicon carbide substrate at least of the further silicon carbide component to be produced is split off.

12. The method of claim 1, wherein the splitting comprises splitting the silicon carbide layer such that a part of the silicon carbide layer remains on the initial wafer after the splitting.

13. The method of claim 1, further comprising:
forming an electrically conductive contact structure of the silicon carbide component to be produced on the surface of the silicon carbide layer, the electrically conductive contact structure electrically contacting the doping region,
wherein the electrically conductive contact structure comprises at least one of metal and polysilicon.

14. The method of claim 1, further comprising:
separating the silicon carbide layer in regions between silicon carbide components to be produced before the splitting.

15. A method for producing a silicon carbide component, the method comprising:
forming a silicon carbide layer on an initial wafer;
forming a doping region of the silicon carbide component to be produced in the silicon carbide layer;
forming an electrically conductive contact structure on the surface of the silicon carbide layer, the electrically conductive contact structure electrically contacting the doping region,
producing a splitting region by pre-damaging the splitting region, wherein the splitting region is produced by laser treating the splitting region before forming the electrically conductive contact structure in order to pre-damage the splitting region;
splitting the silicon carbide layer or the initial wafer along the splitting region after forming the doping region, such that a silicon carbide substrate at least of the silicon carbide component to be produced is split off, wherein the silicon carbide substrate has a thickness of more than 30 µm,
wherein the doping region is formed to extend to a surface of the silicon carbide layer before splitting the silicon carbide layer, and
wherein splitting along the splitting region comprises producing thermal stress.

16. A method for producing a silicon carbide component, the method comprising:
forming a silicon carbide layer on an initial wafer;
forming a doping region of the silicon carbide component to be produced in the silicon carbide layer;
forming an electrically conductive contact structure on the surface of the silicon carbide layer, the electrically conductive contact structure electrically contacting the doping region,
producing a splitting region by pre-damaging the splitting region, wherein the splitting region is produced by laser treating the splitting region before forming the electrically conductive contact structure in order to pre-damage the splitting region;
splitting the silicon carbide layer or the initial wafer along the splitting region after forming the doping region, such that a silicon carbide substrate at least of the silicon carbide component to be produced is split off, wherein the silicon carbide substrate has a thickness of more than 30 µm,
wherein the doping region is formed to extend to a surface of the silicon carbide layer before splitting the silicon carbide layer, and
wherein splitting along the splitting region comprises applying mechanical force.

* * * * *